United States Patent
Gutierrez et al.

(10) Patent No.: US 6,708,132 B1
(45) Date of Patent: Mar. 16, 2004

(54) MICROSYSTEMS INTEGRATED TESTING AND CHARACTERIZATION SYSTEM AND METHOD

(75) Inventors: Adolfo O. Gutierrez, Troy, NY (US); Steven C. Aceto, Wynantskill, NY (US); Michelle D. Simkulet, Cohoes, NY (US)

(73) Assignee: InterScience, Inc., Troy, NY (US)

( * ) Notice: Subject to any disclaimer, the term of this patent is extended or adjusted under 35 U.S.C. 154(b) by 114 days.

(21) Appl. No.: 09/979,625

(22) PCT Filed: Jun. 2, 2000

(86) PCT No.: PCT/US00/15291

§ 371 (c)(1),
(2), (4) Date: Nov. 23, 2001

(87) PCT Pub. No.: WO00/75675

PCT Pub. Date: Dec. 14, 2000

(51) Int. Cl.[7] .............................................. G01R 27/28
(52) U.S. Cl. ........................ 702/117; 702/57; 702/64; 702/115; 324/243; 324/751; 324/765; 714/735; 714/742; 700/302; 700/303; 73/1.41; 73/1.45
(58) Field of Search ................................ 702/57–59, 64, 702/65, 108, 115, 117, 118, 119, 120, 122–124, 183, 185, 188, 189, FOR 103–106, 134, 135, 170, 171; 324/751–753, 765, 244, 243, 252; 382/145, 147, 151, 154, 277; 73/1.41, 1.45, 1.56; 438/14, 16, 17, 18.5, 7.1; 700/108, 110, 302, 303; 714/724, 726, 729, 735, 742; 716/18

(56) References Cited

U.S. PATENT DOCUMENTS

| | | |
|---|---|---|
| 4,599,559 A | 7/1986 | Evans |
| 4,607,525 A | 8/1986 | Turner et al. |
| 4,755,746 A * | 7/1988 | Mallory et al. ............. 324/158 |
| 5,105,147 A | 4/1992 | Karasikor et al. |
| 5,127,726 A | 7/1992 | Moran et al. |
| 5,479,252 A | 12/1995 | Worster et al. |
| 5,526,116 A | 6/1996 | de Groot et al. |
| 5,671,050 A | 9/1997 | de Groot et al. |
| 5,773,951 A | 6/1998 | Markowski et al. |
| 5,877,421 A | 3/1999 | Biebl et al. |
| 5,890,099 A | 3/1999 | Abendroth |
| 5,923,430 A | 7/1999 | Worster et al. |
| 5,990,473 A | 11/1999 | Dickey et al. |
| 6,219,145 B1 | 4/2001 | Gutierrez et al. |
| 6,317,506 B1 * | 11/2001 | Helbig et al. ............... 382/107 |
| 6,341,259 B1 | 1/2002 | Gutierrez et al. |
| 6,490,368 B2 * | 12/2002 | Roder ........................ 382/147 |

OTHER PUBLICATIONS

Mishra et al., A Microcontroller Based Intelligent Instrumentation System For Automatic Scanning of CCD Camera Vision System, Jan., 1993, IEEE, pp. 526–529.*
Gupta et al., A Wafer–Scale MEMS & Analog VLSI System for Active Drag Reduction, Jan. 1996, IEEE, pp. 46–52.*
Butler et al., Advanced Multichip Module Packaging of Micro–electromechanical Systems, IEEE, Jan. 1997, pp. 261–264.*

(List continued on next page.)

Primary Examiner—Marc S. Hoff
Assistant Examiner—Elias Desta
(74) Attorney, Agent, or Firm—Jay R. Yablon; Michelle Simkulet

(57) ABSTRACT

An improved microsystems testing and characterization system which allows the system user to identify specific structures, and thereby to initiate an automated testing sequence to be applied to that structure or a series of structures. The integrated control system that governs the present invention automates the power supply to the device under test, the precision motion control of all components, the sensor operation, data processing and data presentation. Therefore operation is autonomous once the microstructure is in place and the testing sequence is specified. The integrated testing system can be used to perform tests on an entire wafer or on a single die.

19 Claims, 4 Drawing Sheets

OTHER PUBLICATIONS

Gabriel, Micro–electromechanical Systems Tutorial, Oct. 1998, IEEE, pp. 432–441.*

Cowan, WD; Bright, VM & Dalton, GC. "Measuring Frequency Response of Surface–Micromachined Resonators". SPIE vol. 3225, Sep. 1997, pp. 32–43.

Nelson, PR; Chu, PB; & Pister, KSJ. "Optical Methods for Characterization of MEMS Devices in Motion", SPIE vol. 2640, Sep. 1995, pp. 53–57.

Gutierrez, A; Edmans, D. Seidler, G, et al. "MEMS Metrology Station Based on Two Interferometers"., SPIE vol. 3225, Sep. 1997, pp. 23–31.

Postek, MT. "The Potentials for Inspection and Metrology of MEM S using a Combined Scanning Electron Microscope (SEM) and Proximal Probe Microscope (PPM)", SPIE vol. 3225, Sep. 1997, pp. 92–101.

Grosser, V, Bombach, C, Faust, W.; et al. "Optical Measurement Methods for MEMS Applications", SPIE vol. 3407, Sep. 1998, pp. 340–347.

Cowan, WD; Bright, VM; Lee, MK; et al. "Design and Testing of Polysilicon Surface–Micromachined Piston Micromirror Arrays", SPIE vol. 3292, Apr. 1998, pp. 60–70.

Salen, JA; Athas, GJ; Barnes, D; et al. "Developments in Focused Ion Beam Metrology", SPIE vol. 3507, Sep. 1998, pp. 216–224.

Randall, NX; Soden, RA. "Characterization of MEMS mechanical properties using naroscale techniques", SPIE vol. 4558, Oct. 2001, pp. 281–294.

* cited by examiner

MICROSYSTEMS INTEGRATED TESTING AND CHARACTERIZATION SYSTEM AND METHOD

FIELD OF THE INVENTION

This invention relates to the field of microsystems characterization systems, and particularly to microelectromechanical microsystems characterization systems.

BACKGROUND OF THE INVENTION

The present invention comprises a testing and characterization system to provide automated multi-domain measurements of a wide range of microsystem devices in either single chip or wafer format. Unlike electronic devices and integrated circuits in which only lumped electrical parameters are needed for device level modeling, microsystem devices require the precise and simultaneous measurement of multi-domain parameters, often widely dissimilar. In the microelectrical domain, probe stations, waveform generators and current-voltage measurement equipment are all instruments used for modeling and or testing based on lumped electrical circuits. However, they are not capable of providing characterization of the mechanical or fluidic properties common in microsystem devices.

Typical microsystem devices that would benefit from the testing and characterization capabilities of the present invention include present and future devices with vibratory or bistable motion in either the horizontal or vertical direction, fluidic properties, or optical properties. Such devices include but are not limited to accelerometers, diffraction gratings, pumps, gyroscopes, micromirrors, micromicrophones, drive motors. actuators and diaphragms.

Current technology and prior art carried over from electronic device testing tend to provide means for testing a few characteristics of the micros,stem devices, primarily electrical. However, these technologies often lack the ability to characterize the results of the electrical stimulus, i.e. mechanical motion. Similarly, prior art exists that is capable of non-contact examination of the topology of wafers or devices in search of structural defects, but these systems too are incapable of characterizing the mechanical motion or fluidic operation of these wafers or devices. Overall, they lack an overall multi-domain characterization ability that is needed to establish the microsystem devices as viable components suitable for full scale manufacturing.

For example, U.S. Pat. No. 5,773,951 by Markowski and Cosby provides a means of wafer only level electrical probing. As discussed above, this technology is capable of testing and verifying the electrical contacts of the microsystems device, but is unable to characterize the operation resulting from the electrical stimulus.

Similarly, several U.S. patents appear to disclose non-contact surface profiling in the determination of structural defects. These include U.S. Pat. No. 5,127,726 by Moran which provides a high resolution surface inspection system: U.S. Pat. No. 5,105,147 by Karasikov and Ilssar which provides a optical inspection system for wafers; U.S. Pat. No. 4,607,525 by Turner and Roch which provides an air probe for wafer contouring. U.S. Pat. No. 5,526,116 and U.S. Pat. No. 5,671,050 by de Groot which provide an optical means of surface profiling for wafer inspection; and U.S. Pat. No. 5,479,252 by Worster .et al., which provides a confocal laser scanning system for defect detection in wafers. However, these systems often lack the ability to provide electrical stimulus to characterize the resultant surface structure or more importantly, to perform microsystem operation.

OBJECTS OF THE INVENTION

Therefore, it is the object of the invention disclosed herein to provide an integrated testing and characterization system for wafer level microsystem technologies.

It is also an object of the invention to provide an integrated testing and characterization system for die level microsystem technologies.

SUMMARY OF THE INVENTION

The present invention provides an improved microsystems testing system. By identifying specific structures, the user can initiate an automated testing sequence 106 to be implemented on that structure or a series of structures. The integrated control system that governs the present invention automates power supply to the device under test 101, precision motion control of all components, sensor 134 operation, data processing and data presentation. Therefore operation is autonomous once the microstructure is in place and the testing sequence is specified. The integrated testing system can be used to perform tests on an entire wafer or on a single die.

BRIEF DESCRIPTION OF THE DRAWINGS

The features of the invention believed to be novel are set forth in the associated claims. The invention, however, together with further objects and advantages thereof may best be understood by reference to the following description taken in conjunction with the accompanying drawings in which:

DETAILED DESCRIPTION

The present invention provides an improved testing system for microsystems technology. The overall goal of the system is to provide a basic means of performing automated tests designed to analyze the performance and characterize the operation of microsystems technology. The testing system can be implemented on wafer or die level microsystems, also know as microelectromechanical systems (MEMS). The testing system is predominantly automated, relying on the device design file 101 used to lay out and ultimately manufacture the wafer based structures to "navigate" the wafer or die. Although the primary application of the testing system is single wafer or die testing, for example in a research and development setting, this system could be incorporated into an assembly line for fully automated manufacturing testing within the scope of the invention and its associated claims.

Figure 1:
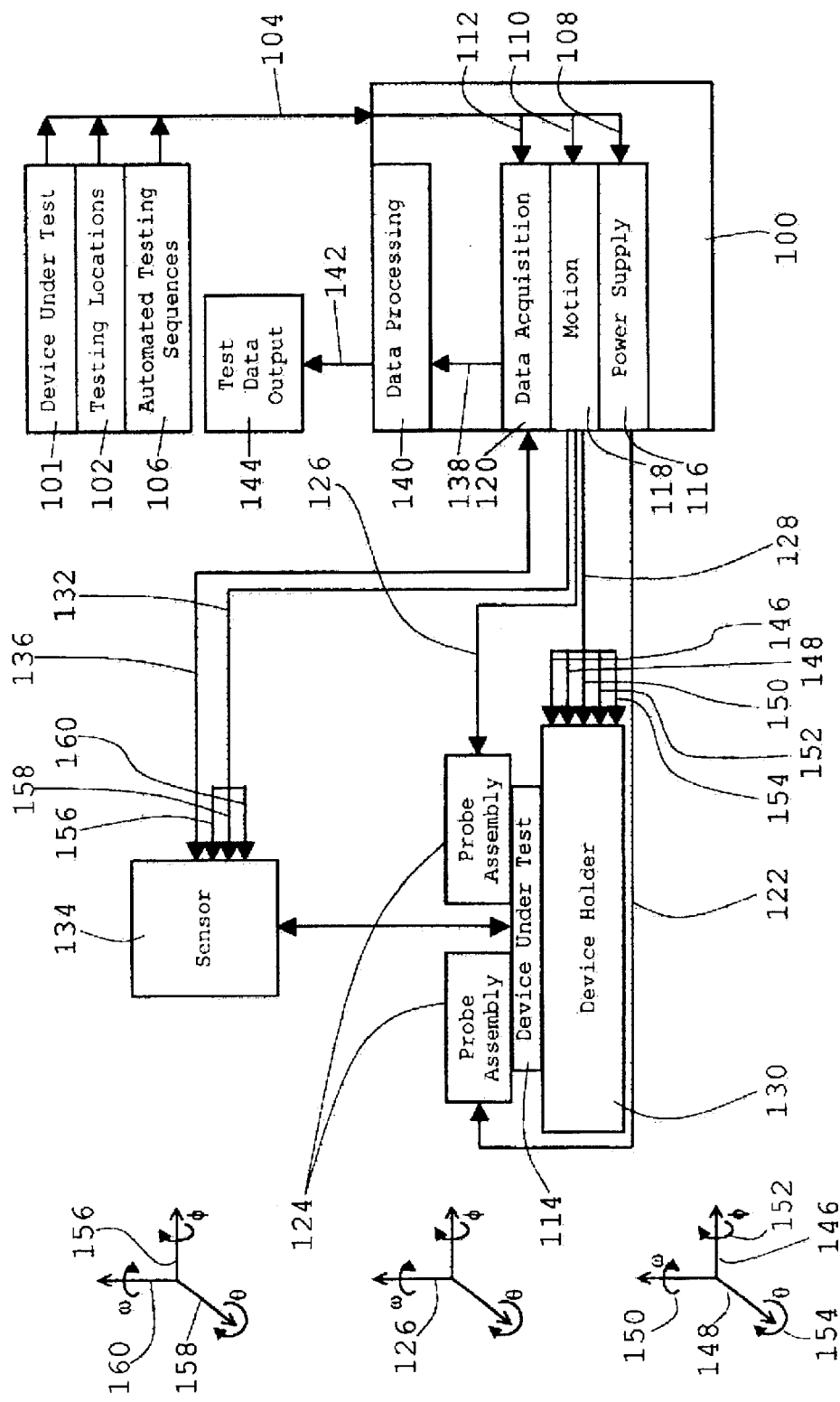
FIG. 1 is a block diagram schematically illustrating the entire integrated system of a preferred embodiment of the invention.

A preferred embodiment of the invention can best be described with reference to FIG. 1. Controller 100 receives device design file 101 along input train 104. Device design file 101 comprises the layout file created to manufacture the wafer, and is used for navigation purposes by the testing system.

Controller 100 also receives testing locations input 102 along input train 104. In embodiment of FIG. 1, testing locations input 102 comprises software level identification by the user of features and/or structures to be tested. The software level identification takes place in relation to device design file 101, which as noted above, comprises the layout file/program used to create the structure or a file/program compatible thereto. The testing locations input 102 can be identified by the user, for example, through coordinate input or a cursor/cross-hair based point and click scheme, again, based on the information contained within device design file 101. The location of the features and/or structures to be tested is stored by controller 100 for implementation in the testing sequence.

Testing parameters input 106 is also transferred to controller 100 along input path 104. Testing parameters input 106 comprises information regarding the specifications of the testing sequence to be implemented. In the embodiment of FIG. 1, testing parameters input 106 comprises power supply parameters 108, motion parameters 110, and data acquisition parameters 112 to be applied to the device under test 114. Power supply parameters 108 are applied to power supply module 116 of controller 100. Motion parameters 110 are applied to motion module 118 of controller 100. Data acquisition parameters 112 are applied to data acquisition module 120 of controller 100. The testing sequence comprises a series of one or more testing steps to be performed, in series, and/or in parallel, as appropriate, at the one or more testing locations identified in testing locations input 102.

Therefore, the input to controller 100 essentially comprises device design file 101, testing locations input 102, and testing parameters input 106. As mentioned above, device design file 101 comprises the layout file used to manufacture the wafers. This design file 101 is used for navigation purposes by the controller 100. It provides pre-test location information and serve as a basis for user identification of preferred testing locations 102. With this feature, users can identify testing locations 102 in a familiar format, in any desired magnification level, without necessitating scanning and evaluation of the actual wafer/device. Testing parameters input 106 provides a means for the user to provide all necessary testing specification variables for the testing sequence. And again, testing locations input 102 and testing parameters input 106 are interrelated to one another insofar as various tests specified by, testing parameters input 106 will be performed at various locations specified by testing locations input 102.

Controller 100 is the primary interface between the user and the rest of the system. As described above, input parameters (108, 110, 112) are supplied by the user to controller 100 in order to specify details of the testing sequence to be implemented. Controller 100 is comprised of several modules which govern the operation of particular components of the overall so stem.

Power supply module 116 of controller 100, translates power supply parameters 108 supplied by the user into an applied voltage train 122 that is provided to probe assembly 124. The applied voltage train 122 may comprise a voltage and corresponding time period over which it should be applied to a specific structure on the device under test 114, or a series of voltages and corresponding time periods to be applied to a specific structure on the device under test 114 in a specific sequence.

Motion module 118 of controller 100 translates motion parameters 110 supplied by the user into motion control information that is used throughout the entire testing sequence by many components of the system. Motion module 118 provides a probe assembly motion control sequence 126 to probe assembly 124. In the embodiment of FIG. 1, probe assembly 124 moves in the z-direction only. This motion allows probe assembly 124 to be moved into electrical contact with the device under test 114 in order to supply the desired voltages. Typically, probe assembly 124 is lowered from a set point above the device under test 114 to a point at which electrical contact is established between probe assembly 124 and device under test 114.

Motion module 118 also provides a device motion control sequence 128 to device holder 130. In the preferred embodiment, device holder 130 is capable of five axes of motion that include x, y, rotation ω, and two directions of tilt, θ and φ. More specifically, x-axis motion 146, y-axis motion 148, ω rotation 150, θ tilt 152, and φ tilt 154 of the device holder 130 is provided by device motion control sequence 128 from the motion module 118 of controller 100.

Motion module 118 also provides sensor motion control sequence 132 to sensor 134. In the embodiment of FIG. 1, sensor 134 is capable of motion along the x, y, and z axes, though this is not limiting and other motions obvious to someone of ordinary skill can be implemented in alternative embodiments. More specifically, x-axis motion 156, y-axis motion 158, and z-axis motion 160 for sensor 134 is provided by sensor motion control sequence 132 from motion module 118 of controller 100.

Alternative embodiments the invention include alternative axial and rotational/tilt motion capabilities for probe assembly 124, device holder 130 and sensor 134. These alternative embodiments are described in more detail later.

Data acquisition module 120 of controller 100, translates data acquisition parameters 112 supplied by the user to sensor 134 along data acquisition pathway 136. Subsequently, the raw test data acquired by sensor 134 is fed along the same pathway from sensor 134 to data acquisition module 120 of controller 100. From there, the acquired raw data is sent along the data pathway 138 to data processing module 140 of the controller 100. The raw test data is then processed, and this processed test data is then sent along the output pathway 142 to be presented as output 144 to the user.

In the preferred embodiment, sensor 134 is a single point laser based reflectometer sensor capable of making surface profile measurements as well as single point measurements. Alternative embodiments of the present invention provide alternative sensing techniques/sensors 134 that provide operational information about the microsystem device under test 114 once power is applied. Such alternative sensing techniques/sensors 134 include but are not limited to thermal imaging, thermal microscopic imaging, interferometric sensing, profilometric sensing, triangulation sensing, and CCD imaging. These alternative sensing techniques would easily assimilate into and be encompassed by the overall structure of the present invention and operational details would be the same. Of course, the nature of sensor 134 is related to the nature of the data which data acquisition module 120 can direct sensor 134 to acquire.

Figure 2:
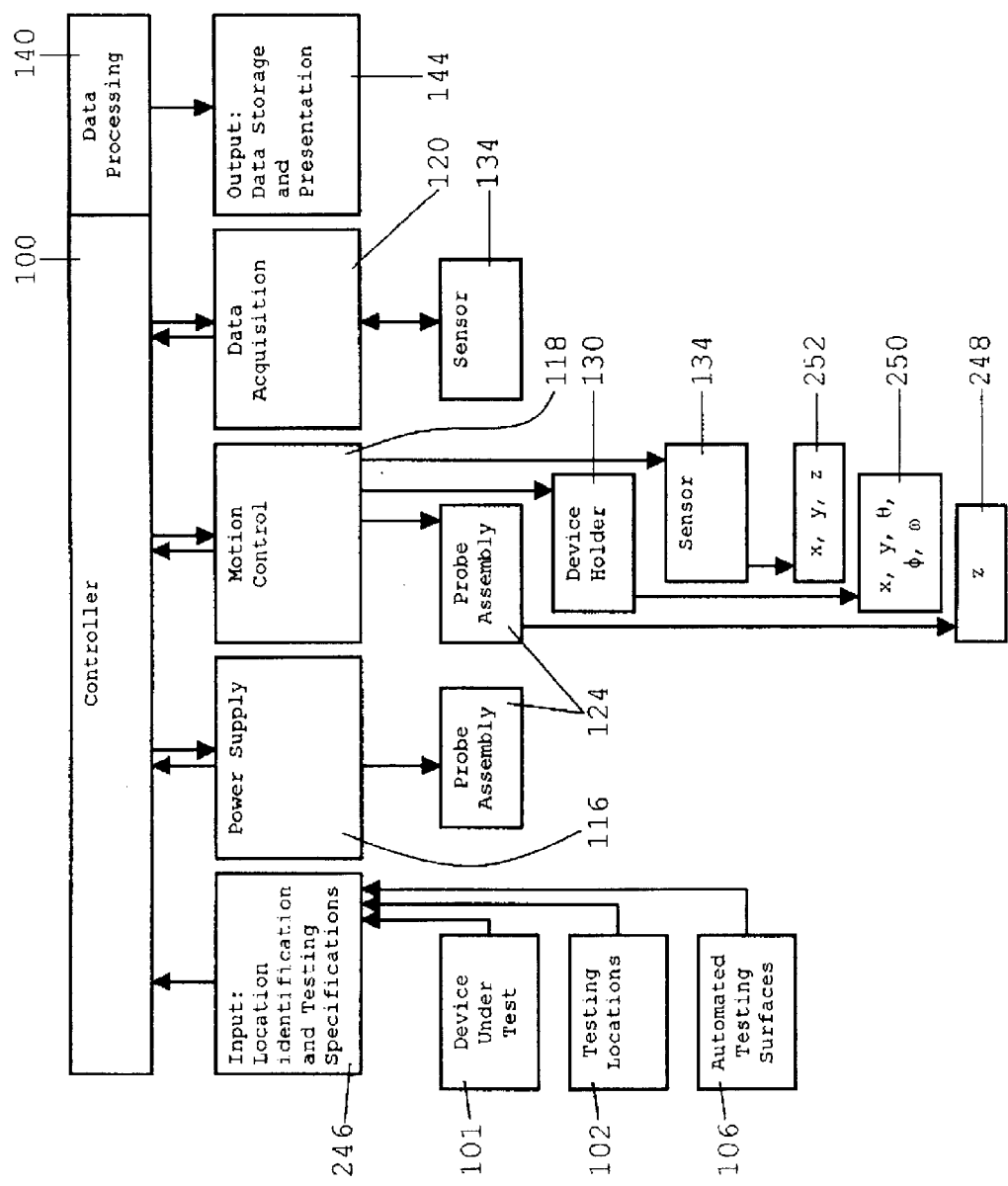
FIG. 2 is a block diagram of the integrated control system architecture of the embodiment of FIG. 1.

The operation of the controller 100 can best be described with reference to the diagram in FIG. 2, which illustrates the input and output signals of controller 100. Controller 100 receives input 246 which comprises device design file 101, testing locations input 102 and testing parameters input 106 as described above. Controller 100 then provides input and receives feedback from its submodules, namely power supply module 116, motion module 118, and data acquisition module 120.

More specifically as earlier described, power supply module 116 provides power input to probe assembly 124. Motion control module 118 provides motion input to probe assembly 124 for motion in the z-direction (248). Motion control module 118 also provides input to device holder 130 for 5 axis motion specifically x, y, rotation and two directions of tilt θ and φ (250). Motion control module 118 also provides motion input to the sensor 134 for motion in the x, y, and z direction (252). Data acquisition module 120 provides input and receives feedback from sensor 134. Processed test data output 144 from data processing module 140 of controller 100 is available to the user for storage and presentation 144.

Figure 3:
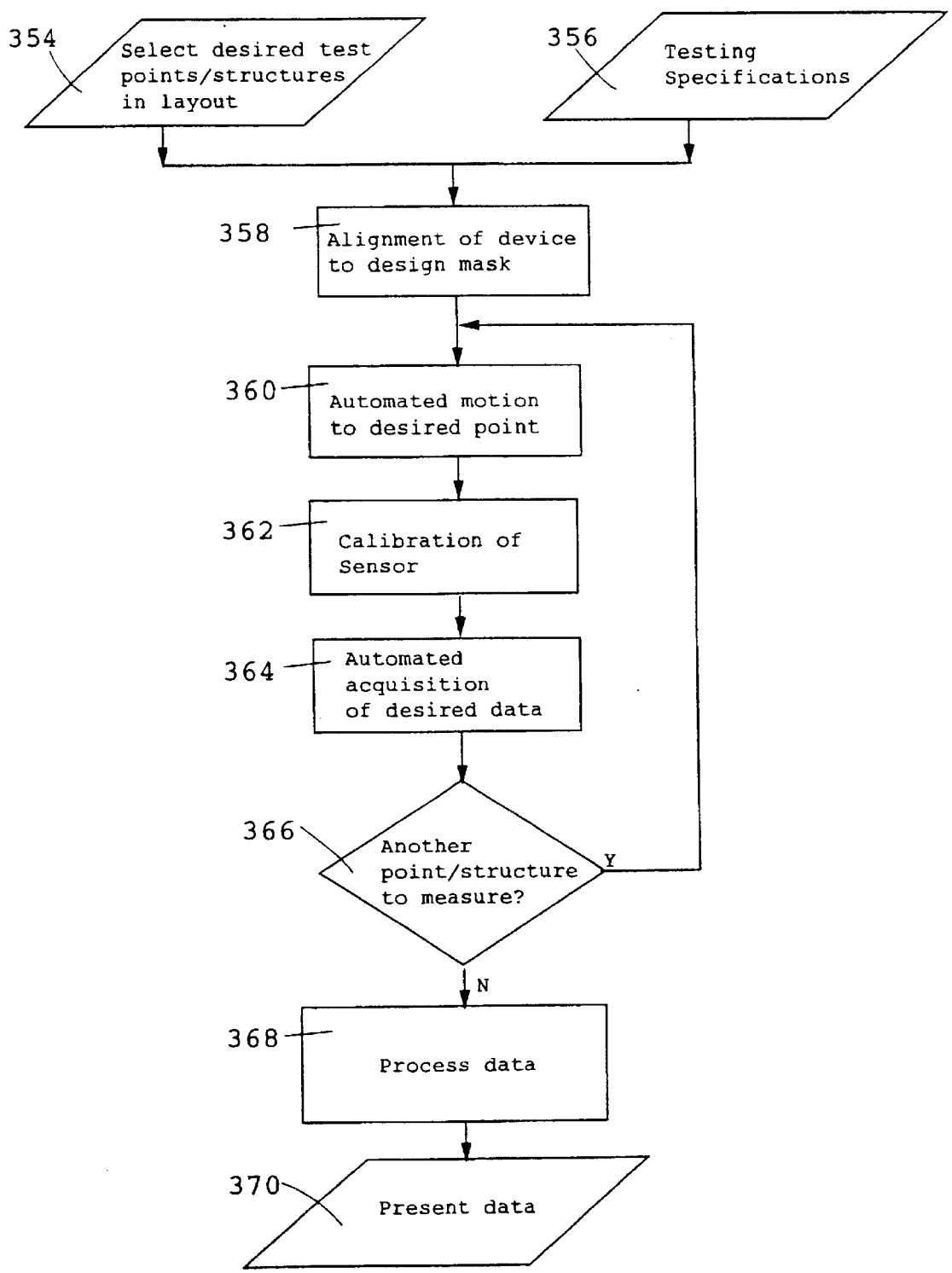
FIG. 3 is a flowchart of the operation of the integrated system of the embodiment of FIG. 1.

FIG. 3 is a flowchart depicting the operation of this embodiment of the invention. At input box 354 testing locations input 102 is introduced to controller 100. As mentioned above, testing locations input 102 comprises location identification supplied by the user of structures or points to be tested in the testing sequence. The location identification takes place in a suitable representation of the device under test 114 in design layout software. That is to say, controller 100, in the preferred embodiment, uses the very device design file 101 that a device is designed in, and which is used to manufacture the device, to navigate the device under test 114 for testing purposes. This allows the user detailed and exact layout parameters from which to specify exact locations for test implementation. As noted earlier, testing locations input 102 may comprise, for example, point and click cross-hair identification with a mouse or, alternatively, coordinate input, all in relation to device design file 101.

At input box 356 testing parameters input 106 is introduced to controller 100. As mentioned above, testing parameters input 106 comprises testing specifications such as, but not limited to, sensor type, testing sequence, power or voltage ranges or sequences, and timing sequences, in relation to testing locations identified by 102.

At process box 358, controller 100 implements an alignment procedure to ensure that device under test 114 is accurately aligned along the axes of motion. The alignment procedure is necessary to establish a precise relative positional relationship between the locations specified by the user (testing locations input 102) via device design file 101 and the actual device under test 114 relative to sensor 134. That is, sensor 134 and device under test 114 are aligned with one another so as to calibrate properly against the locations specified in device design file 101, prior to initiating testing. This alignment utilizes motion of device holder 130 to ensure proper axial and planar alignment of the device under test 114. Feedback front the sensor 134 verifies alignment results and adjustments can be made to all five axes until alignment meets standards set by controller 100.

Operation continues with process box 360 in which controller 100, via motion module 118 of the controller 100, initiates the motion of all components necessary to position the sensor 134 at the first point on the device under test 114 to be tested as specified by testing locations input 102. This automated motion may comprise motion of the device under test 114 via device holder 130, motion of probe assembly 124 and/or motion of sensor 134. The purpose of the motion is to align sensor 134 with the specific point of device under test 114 to be tested. Once sensor 134 is properly aligned to the desired location of device under test 114, probe assembly 124 is lowered to contact device under test 114 to provide the required power to activate device under test 114.

In the preferred embodiment of the invention, gross motion is achieved by device holder 130 for such purposes as initial alignment and motion between test points. Subsequent precise motion is achieved by sensor 134, for such purposes as motion within a testing sequence. According to this embodiment, device holder 130 is capable of a large range of axial motion with less accuracy, and sensor 134 is capable of a much shorter range of axial motion but with great accuracy. Alternative embodiments for this motion will be obvious to someone of ordinary skill, and are considered within the scope of this disclosure and its associated claims.

Operation continues with process box 362, in which controller 100 initiates the calibration of sensor 134. The specifics of the calibration routine will vary dependent upon the specific type of sensor 134 being used. However, calibration 362 comprises a combination of input from motion module 118 and data acquisition module 120 of controller 100. Typically, the calibration routine will test the operation of the sensor 134 to ensure that it is in a proper operating range and produces accurate and expected results.

Operation continues with process box 364, in which controller 100 initiates the acquisition of the data specified by the user in testing parameters input 106. This operation may employ one or more of data acquisition module 120, power supply module 116 and motion module 118 of controller 100. The specified test is implemented by sensor 134 and results sent to data acquisition module 120 of controller 100. At the end of the acquisition of the desired raw test data, probe assembly 124 is typically raised to cease power to device under test 114. This allows for ease of motion to the next desired testing point or replacement of the device under test 114. This cessation of power prior to movement is particularly required for wafer level testing, since each structure has an independent set of pads from which it draws power.

Operation continues with decision box 366 in which controller 100 is queried internally based on testing location input 102 whether there is another point to be tested. If there is another point to be tested, operation loops back to just above process box 360 and continues again from there. This loop continues until all points specified by testing locations input 102 have been tested. Once the internal query is negative, the operation continues with process box 368 in which all raw test data is transferred from the data acquisition module 120 to data processing module 140 of controller 100.

Once the raw test data is processed in data processing module 140, operation completes with output box 370 in which the processed test data is presented 144 by controller 100 to the user 144 for additional manipulation or storage.

Figure 4:
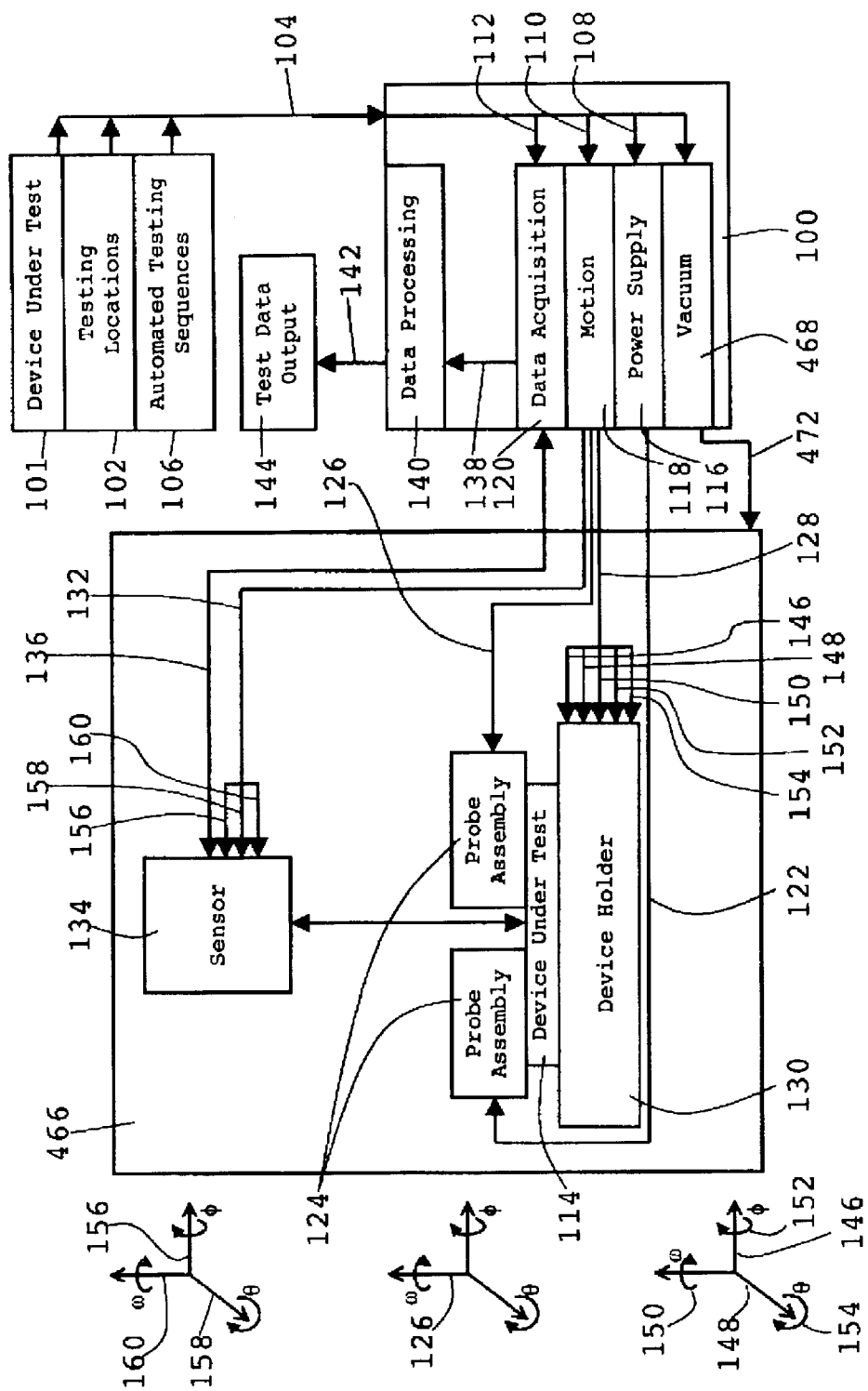
FIG. 4 is a block diagram of an alternative embodiment of the invention in which a vacuum and vacuum control means are added to facilitate vacuum testing.

A first alternative embodiment of the invention is presented in FIG. 4 in which the testing components such as the device under test 114, probe assembly 124, device holder 130, and sensor 134 are enclosed within a vacuum chamber 466 to allow for specialized testing sequences requiring vacuum conditions. Aside from this creation of the vacuum conditions, the system operates exactly as described above. The vacuum conditions are specified by the user among testing parameters input 106, transferred as vacuum control parameters 470 to vacuum control module 468 and implemented by the controller 100 along pathway 472. Alternatively, the vacuum specifications can be manually implemented by the user. Vacuum system control parameters that must be monitored for testing under vacuum conditions include but are not limited to a vacuum pressure sensor within a vacuum vessel, a vacuum pump, venting valves for vacuum elimination, and bleed valves for vacuum pressure control and regulation. The primary purposes for testing microsystems components in a vacuum environment is to mimic actual operating conditions or to provide a testing environment in which the Microsystems devices are not subjected to effects of atmospheric pressure during operation.

Another significant alternative embodiment to the present invention is a simplified system in which there is no need for a device design file 101 or testing location information 102 along input train 104. The only input to the system comprises testing parameters 106 along input path 104. The testing parameters 106 comprise power supply parameters 108, motion parameters 110, and data acquisition parameters 112. In this embodiment, the sensor 134 is essentially used to scan a designated area of the entire device under test 114. This embodiment is useful if no device design file 101 is available to the user. With the sensor 134 being the single point reflectometer as in the preferred embodiment, the output 144 essentially comprises device identification and location information as preliminary results to be used to specify more exact testing sequences.

Further alternative embodiments include modifications to the operation of the invention as presented in the flowchart in FIG. 3. For example, the calibration of sensor 134 in process box 362 is only required to precede the acquisition of raw test data in process box 364, but is not required to follow any operation except the testing locations and testing parameters input (102 and 106) represented by input boxes 354 and 356. Therefore, the calibration of the sensor 134 (process box 362) can occur either before, after or in between process boxes 358 and 360. Similarly, if multiple points or structures are to be measured, the acquired raw test data can be moved to data processing module 140 before the controller 100 moves on to the next structure. That is to say, in FIG. 3, process box 368 can be moved above decision box 366 without disrupting the operational flow. Other, similar modifications may occur to someone of ordinary skill and are considered to be within the scope of this invention and its associated claims.

A further alternative embodiment involves motion module 110 and its axial control of device holder 130, sensor 134 and probe assembly 124. Although specific axes of motion for the preferred embodiment were detailed above, alternative axes of motion for each of the three components 130, 134 and 124 controlled by the motion module 110 are possible. That is to say that the motion is not limited to that described in the preferred embodiment, but can be established in a number of ways that will be apparent to someone of ordinary skill.

While only certain preferred features of the invention have been illustrated and described, many modifications, changes and substitutions will occur to those skilled in the art. It is, therefore, to be understood that this disclosure and its associated claims are intended to cover all such modifications and changes as fall within the true spirit of the invention.

We claim:

1. A system for testing a microelectromechanical device under test, comprising:

testing parameters information specifying a testing sequence comprising at least one testing step to be applied to said device under test;

a sensor acquiring raw test data pertaining to said device under test in accordance with said testing sequence;

motion control means for navigating said sensor relative to said device under test and controlling relative motion and orientation between said sensor and said device under test; and controller means for applying the specified steps of the specified testing sequence to said device under test, using said sensor and said motion control means; wherein:

said testing parameters information comprises power parameters (108) specifying at least one voltage train to be applied to said device under test; and said raw test data comprises data characterizing mechanical motion of said device under test, resulting from applying said voltage train.

2. The system of claim 1, further comprising:

device design information comprising layout information about said device under test; and testing locations information specifying at least one location to be tested of said device under test; wherein:

said testing sequence specifies said at least one testing step in relation to said at least one location to be tested;

said motion control means navigates said sensor and controls said relative motion and orientation, based upon relating said testing locations information to said device design information; and said controller means applies said specified steps of said specified testing sequence, in relation to said specified locations to be tested, and based upon relating said device design information, said testing locations information and said testing parameters information to one another.

3. The system of claim 2, further comprising:

computerized means for processing said raw test data acquired by said sensor and providing the processed test data to a user of said system.

4. The system of claim 2, wherein said layout information comprises layout information used to manufacture said device under test.

5. The system of claim 2, wherein said testing parameters information comprises motion parameters specifying at least one location to be tested of said device under test.

6. The system of claim 2, wherein said testing parameters information comprises data acquisition parameters specifying at least one type of test data to be acquired by said sensor, pertaining to said device under test.

7. The system of claim 2, further comprising a vacuum chamber enclosing at least said device under test and said sensor, wherein said testing parameters information comprises vacuum control parameters used to control said vacuum chamber.

8. The system of claim 2, wherein said testing parameters information further comprises:

motion parameters specifying at least one location to be tested of said device under test; and data acquisition parameters, specifying at least one type of test data to be acquired by said sensor, pertaining, to said device under test.

9. The system of claim 2, wherein said sensor is selected from the sensor group consisting of: a laser based reflectometer, a profilometer, an interferometer, a thermal imager, a triangulation sensor, and a CCD imager.

10. A method for testing a microelectromechanical device under test, comprising the steps of:

specifying a testing sequence comprising at least one testing step to be applied to said device under test, using testing parameters information;

acquiring raw test data pertaining to said device under test in accordance with said testing sequence, using a sensor;

navigating said sensor relative to said device under test and controlling relative motion and orientation between said sensor and said device under test, using motion control means; and applying the specified testing sequence to said device under test, and using said sensor and said motion control means, using controller means:

said step of specifying a testing sequence using testing parameters information comprising the further step of specifying at least one voltage train to be applied to said device under test, using power parameters; and said step of acquiring raw test data further comprising the step of characterizing mechanical motion of said device under test, resulting from applying said voltage train.

11. The method of claim 10, further comprising the steps of:

providing device design information comprising layout information about said device under test;

specifying at least one location to be tested of said device under test using testing locations information, using testing locations information;

specifying said at least one testing step of said testing sequence in relation to said at least one location to be tested;

navigating said sensor and controlling said relative motion and orientation, based upon relating said testing locations information to said device design information; and applying said specified steps of said specified testing sequence, in relation to said specified locations to be tested, and based upon relating said device design information, said testing locations information and said testing parameters information to one another.

12. The method of claim 11, further comprising the step of:

processing said raw test data acquired by said sensor and providing the processed test data to a user of said system, using computer means.

13. The method of claim 11, said layout information comprising layout information used to manufacture said device under test.

14. The method of claim 11, said step of specifying a testing sequence using testing parameters information comprising the further step of specifying at least one location to be tested of said device under test, using motion parameters.

15. The method of claim 11, said step of specifying a testing sequence using testing parameters information comprising the further step of specifying at least one type of test data to be acquired by said sensor, pertaining to said device under test, using data acquisition parameters.

16. The method of claim 11, further comprising the step of providing a vacuum chamber enclosing at least said device under test and said sensor; said step of specifying a testing sequence using testing parameters information comprising the further step of controlling said vacuum chamber using vacuum control parameters.

17. The method of claim 11, said step of specifying a testing sequence using testing parameters information comprising the further steps of:

specifying at least one type of test data to be acquired by said sensor, pertaining to said device under test, using data acquisition parameters.

18. The method of claim 11, comprising the further step of selecting said sensor from the sensor group consisting of: a laser based reflectometer, a profilometer, an interferometer, a thermal imager, a triangulation sensor, and a CD imager.

19. A method for testing a microelectronic device under test, comprising the steps of:

navigating a sensor acquiring raw test data pertaining to said device under test relative to said device under test and controlling relative motion and orientation between said sensor and said device under test, based upon relating testing locations information specifying at least one location to be tested of said device under test to device design information comprising layout information about said device under test, using motion control means; and applying specified steps of a specified testing sequence comprising testing parameters information to said device under test at the specified locations to be tested, based upon relating said device design information, said testing locations information and said testing parameters information to one another, and using said sensor and said motion control means, using controller means.

* * * * *